United States Patent [19]

Kazuo

[11] 4,075,565

[45] Feb. 21, 1978

[54] SINGLE SIDE-BAND WAVE GENERATION SYSTEM

[75] Inventor: Arai Kazuo, Kitamoto, Japan

[73] Assignee: Nissan Denshi Kabushikikaisha, Japan

[21] Appl. No.: 686,681

[22] Filed: May 17, 1976

[30] Foreign Application Priority Data

Oct. 17, 1975 Japan ............................. 50-125493

[51] Int. Cl.² ............................................. H04B 1/04
[52] U.S. Cl. .................................. 325/138; 325/137; 325/50; 332/45
[58] Field of Search ............... 325/137, 138, 136, 153, 325/49, 50, 135, 47, 48, 146, 139; 332/44, 45

[56] References Cited

U.S. PATENT DOCUMENTS

| 2,098,373 | 11/1937 | Brown | 325/138 |
|---|---|---|---|
| 3,020,398 | 2/1962 | Hyde | 325/138 |
| 3,196,352 | 7/1965 | Hopner et al. | 325/49 |
| 3,311,828 | 3/1967 | Chasek | 325/138 |
| 3,358,234 | 12/1967 | Stover | 325/50 |
| 3,360,729 | 12/1967 | Palatinus | 325/137 |
| 3,460,041 | 8/1969 | Orwin et al. | 325/137 |
| 3,644,831 | 2/1972 | Lather et al. | 325/153 |
| 3,854,094 | 12/1974 | Towler | 325/153 |

FOREIGN PATENT DOCUMENTS 2,413,500  9/1975  Germany ............................. 325/50

Primary Examiner—Robert L. Griffin
Assistant Examiner—Tommy P. Chin
Attorney, Agent, or Firm—Wills, Green & Mueth

[57] ABSTRACT

A single sideband wave generation system for a transmitter, including two oscillators whose outputs are mixed to produce an IF wave from which a carrier wave is developed. This carrier wave is modulated by an audio frequency signal, and filtered to produce a single sideband audio signal, which is then mixed selectively with the outputs of the two oscillators to develop upper and lower sidebands of a transmission frequency. The frequency difference between the two oscillators is $2^n$ times the carrier wave frequency, with $n$ flip flop units or their equivalent being employed to reduce the difference frequency down to the carrier frequency.

19 Claims, 1 Drawing Figure

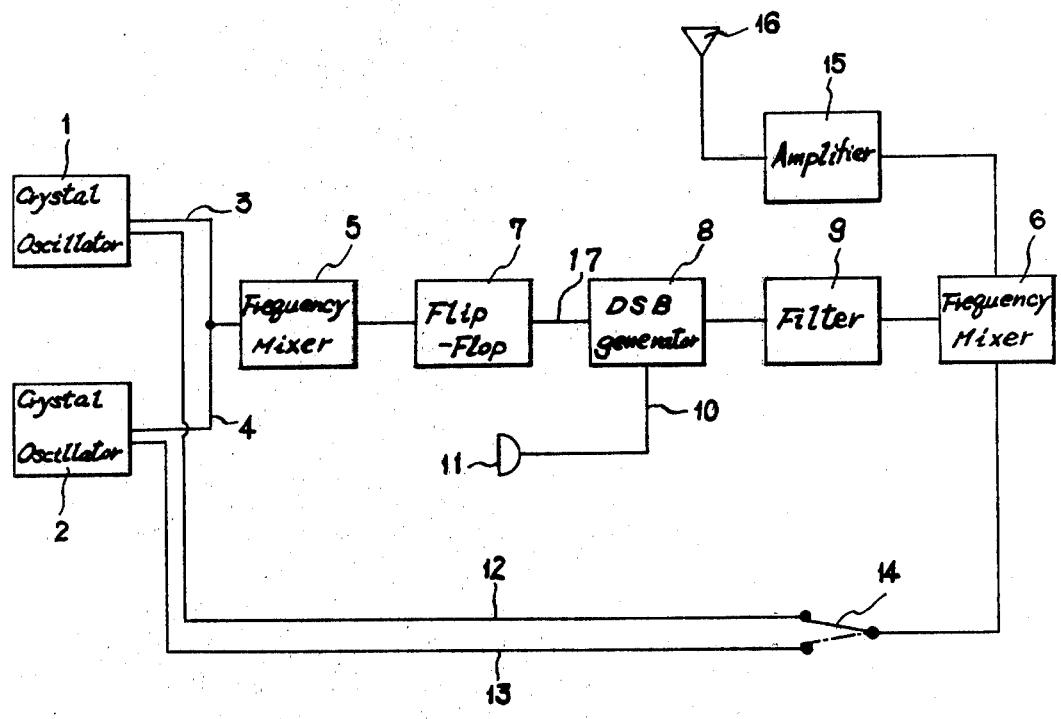

SINGLE SIDE-BAND WAVE GENERATION SYSTEM

BACKGROUND OF THE INVENTION

This invention relates to improvements in a single sideband wave generation system for a transmitter, typically in a transceiver.

Prior to the present invention, single sideband wave generation systems have required three separate crystal oscillators, one for the upper sideband wave, a second for the lower sideband wave, and a third for the carrier wave. In addition, such systems have included two separate filters, for the upper and lower sideband waves respectively, if both waves are to be selectively transmitted.

The crystal oscillator for generating the carrier wave in these prior conventional arrangements has been very large in size, in order to produce an IF wave of low frequency. Further, the sideband filters have necessarily been of relatively complicated construction, to permit acceptance of waves of very high frequency. Consequently, most transmitters of this kind have been larger and more expensive than would be desired.

SUMMARY OF THE INVENTION

The present invention overcomes the above discussed difficulties encountered in prior single sideband transmitters. To achieve these results, a single sideband wave generation system embodying the invention includes two crystal oscillators whose frequencies are hereinafter denoted $IF_1$ and $IF_2$ respectively, and which preferably have, in relation to a carrier wave of frequency $IF_3$, such characteristics that the difference between the oscillator frequencies ($IF_1 - IF_2$) equals $2^n$ times the carrier frequency $IF_3$, where $n$ is an integer and may represent the number of flip flops or other frequency dividing components to be employed in dividing the oscillator difference frequency down to the carrier frequency. Further, the first crystal oscillator has the property $IF_1 + IF_3 = F_{ss}$, where $F_{ss}$ is the frequency of the single sideband output wave; and the second oscillator has the property $IF_2 - IF_3 = F_{ss}$. The intermediate frequencies produced by the two crystal oscillators are frequency modulated together, to produce a difference frequency, which is then reduced in frequency by $n$ flip flops or their equivalent, to one $2^n$th of the original difference frequency, to thus produce the desired carrier wave. The carrier wave is then mixed by a double sideband generator (DSB generator) with an audio signal from a microphone or other source, to produce a double sideband wave, from which a filter selects either an upper or lower sideband wave. This upper or lower sideband wave is frequency modulated selectively with the wave from either of the two crystal oscillators, to produce another intermediate frequency which may be transmitted.

BRIEF DESCRIPTION OF THE DRAWING

The accompanying drawing shows a block diagram of an improved single sideband wave generation system constructed in accordance with the invention.

DESCRIPTION OF THE PREFERRED EMBODIMENT

The wave generating system illustrated in the drawing acts to produce at an antenna 16 a single sideband output wave of frequency $F_{ss}$. The system includes first and second crystal oscillators 1 and 2 producing frequencies $IF_1$ and $IF_2$ respectively. The first crystal oscillator 1 has the property $IF_1 + IF_3 = F_{ss}$ in relation to a carrier wave frequency $IF_3$ and the single sideband output frequency $F_{ss}$, while the second crystal oscillator 2 has the property $IF_2 - IF_3 = F_{ss}$. In a presently preferred arrangement in which the previously mentioned integer $n$ is equal to 1, the frequencies of the two oscillators are so related that their difference ($IF_1 - IF_2$ or $IF_2 - IF_1$) is equal to two times the frequency $IF_3$ of the carrier wave produced at the output side 17 of a flip flop 7.

The crystal oscillators 1 and 2 are connected by lines 3 and 4 respectively to a first IF mixer 5, which is in turn connected to a second IF mixer 6 through the mentioned flip flop 7, a double sideband wave generator 8 and a filter 9. To the DSB generator 8 is connected a microphone 11, or other audio frequency signal source through connecting means 10. The first and second crystal oscillators 1 and 2 are also connected through other lines 12 and 13 respectively, and through a selector switch 14, to the second IF mixer 6.

IF waves produced by the two crystal oscillators 1 and 2 are frequency modulated by the first IF mixer 5 to produce a first intermediate frequency wave with a frequency twice that of the carrier wave required. This first IF wave is then reduced in frequency, by the flip flop 7 or other frequency dividing unit, to one-half of the frequency of the wave at the input side of the flip flop, to thus produce the carrier wave of frequency $IF_3$ which is to be delivered to double sideband generator 8. This carrier wave is mixed by the DSB generator 8 with an audio signal from microphone 11 to produce a double sideband wave representing the audio signal. From this double sideband wave the filter 9 selects or passes a desired single sideband wave, that is, an upper sideband wave if an upper sideband filter is employed or a lower sideband wave if a lower sideband filter is employed.

The single sideband wave thus selected by filter 9 is fed to the second IF mixer 6 and then frequency modulated with the IF wave from either the first or second crystal oscillator 1 or 2, through a selector switch 14, to produce a single sideband output IF wave which is transmitted through the antenna 16 after being amplified by an amplifier 15.

In order for the present invention to be more concretely understood, the following example is given in which a single sideband wave of 10.695MHz($F_{ss}$) plus a carrier wave of 455KHz($IF_3$) are required for transmission with an upper sideband filter being utilized at 9, and the first and second crystal oscillators 1 and 2 being selected to produce frequencies of 10.24 MHz ($IF_1$) and 11.15 MHz ($IF_2$) respectively. The two IF waves from oscillators 1 and 2 are fed to IF mixer 5 and frequency modulated there to produce an IF wave of a difference frequency calculated as follows:

$$11.15 \text{ MHz } (IF_2) - 10.24 \text{ MHz } (IF_1) = 910 \text{ KHz}$$

This IF wave with a frequency of 910 KHz is delivered to flip flop 7, which divides the frequency in half to obtain the desired carrier wave of 455 KHz ($IF_3$) in line 17. The carrier wave of 455 KHz frequency is subjected to balanced modulation with an audio signal from microphone 11 by double sideband generator 8, to produce an audio double sideband wave with a frequency of 455 KHz. This audio double sideband wave is fed to filter 9 which passes the upper sideband wave alone.

The upper sideband wave thus selected is frequency modulated by the second IF mixer 6 with the output of oscillator 1 or oscillator 2, as selected by switch 14. If the first crystal oscillator 1 is connected through switch 14 to mixer 6, there is produced by mixer 6 the upper sideband wave of 10.695 MHz($F_{ss}$) according to the following calculation.

$$10.24 \text{ MHz } (IF_1) + 0.455 \text{ MHz } (IF_3) = 10.695 \text{ MHz} (F_{ss})$$

If on the other hand the second crystal oscillator 2 is connected to the mixer 6, the latter produces the lower sideband wave of the same frequency 10.695 MHz, since the following calculation now governs due to the nature of the second crystal oscillator 2, i.e. $IF_2 - IF_3 = F_{ss}$.

$$11.15 \text{ MHz } (IF_2) - 0.455 \text{ MHz } (IF_3) = 10.695 \text{ MHz} (F_{ss})$$

Thus, in accordance with the present invention, there can be employed fewer crystal oscillators than in the prior art, with neither of these oscillators being of the large and expensive type heretofore required for generation of the carrier wave. The overall transmitter can therefore be considerably smaller and less expensive than previous single sideband generators, since only very small high frequency oscillators are required. Moreover, selection between the upper and lower sideband waves for transmission can be effected very simply by actuation of the change-over switch alone without the necessity for use of different upper and lower sideband filters. A single filter, of either upper upper or lower sideband type, serves in both conditions. Also, the low frequency of the wave passing through this single filter (as for example 455 KHz in the typical arrangement discussed, as compared with a frequency of 10.695 MHz in the wave being transmitted) enables this filter to be structurally very simple and thus further reduce the size and cost of the overall transmitter.

It will of course be understood that if the discussed integer $n$ is to be greater than 1, the frequency dividing component 7 of the circuit will include $n$ flip flops or other equivalent circuitry for dividing the frequency by $2^n$.

What is claimed is:

1. Improvement in a single sideband wave generation system for a transmitter characterized by comprising two crystal oscillators having frequencies $IF_1$ and $IF_2$ respectively; a first intermediate frequency mixer connected to the two crystal oscillators, $n$ flip flops connected to the first intermediate frequency mixer, a double sideband wave generator connected to the last of said flip flops, a filter connected to the double sideband wave generator, a microphone connected to the double sideband generator, a second intermediate frequency mixer connected to the filter, an amplifier connected to the second intermediate frequency mixer, and an antenna connected to the amplifier, said crystal oscillators each connecting through separated connecting means and a change-over switch to the second intermediate frequency mixer, one of the crystal oscillators having the property $IF_1 + IF_2 = F_{ss}$ and the other having that of $IF_2 - IF_3 = F_{ss}$ in relation to a single sideband output wave frequency of $F_{ss}$ and a carrier wave frequency of $IF_3$, the difference between the frequencies of the two crystal oscillators ($IF_1 - IF_2$) being $2^n$ times $IF_3$, the frequency of an output wave from said first mixer being divided by $2^n$ by said flip flops to produce said carrier wave, and the outputs of said two oscillators being fed selectively through the change-over switch to said second intermediate frequency mixer to selectively produce either an upper or lower sideband wave to be transmitted.

2. Single sideband wave generating apparatus comprising:
 a first oscillator producing a first wave of a first frequency;
 a second oscillator producing a second wave of a second and different frequency;
 means for mixing said first and second waves to produce a third wave of a third frequency corresponding to the difference between said first and second frequencies;
 means for dividing the frequency of said third wave to produce a carrier wave of a frequency corresponding to a predetermined portion of said third frequency;
 a source of an audio frequency input signal;
 means for producing a modulated wave at said carrier wave frequency modulated by said audio frequency signal; and
 means for mixing said modulated wave with one of said first and second waves to produce a single sideband output wave.

3. Single sideband wave generating apparatus as recited in claim 2, in which said modulated wave is a single sideband wave.

4. Single sideband wave generating apparatus as recited in claim 2, in which said modulated wave is a single sideband wave, and said means for producing said modulated wave include a generator for first producing a double sideband wave from said carrier wave and said audio frequency input signal, and a filter for then separating therefrom said single sideband modulated wave.

5. Single sideband wave generating apparatus as recited in claim 2, in which both of said oscillators are crystal oscillators.

6. Single sideband wave generating apparatus as recited in claim 2, in which said frequency dividing means include flip flop circuitry.

7. Single sideband wave generating apparatus as recited in claim 2, in which said last mentioned means are operable to mix said modulated wave with either of said first and second waves selectively in a relation producing selectively either an upper sideband wave or a lower sideband wave for transmission.

8. Single sideband wave generating apparatus as recited in claim 2, in which said last mentioned means include a mixer to which said modulated wave is delivered, and selector switch means operable to deliver either of said first and second waves selectively to said mixer for mixing with said modulated wave in a relation producing selectively either an upper sideband output wave or a lower sideband output wave.

9. Single sideband wave generating apparatus as recited in claim 2, in which said third frequency is equal to said carrier frequency times $2^n$ where $n$ is an integer.

10. Single sideband wave generating apparatus as recited in claim 2, in which said frequency dividing means include $n$ flip flops, and said third frequency is equal to said carrier frequency times $2^n$, where $n$ is an integer.

11. Single sideband wave generating apparatus as recited in claim 2, in which said third frequency is twice said carrier frequency.

12. Single sideband wave generating apparatus as recited in claim 2, in which said audio frequency signal source is a microphone.

13. Single sideband wave generating apparatus as recited in claim 2, including a transmitting antenna to which said single sideband output wave is delivered.

14. Single sideband wave generating apparatus as recited in claim 2, in which said first frequency plus the frequency of said modulated wave equals the frequency of said single sideband output wave.

15. Single sideband wave generating apparatus as recited in claim 2, in which said second frequency minus the frequency of said modulated wave equals the frequency of said single sideband output wave.

16. Single sideband wave generating apparatus comprising:
   a first crystal oscillator producing a first wave of a first frequency;
   a second crystal oscillator producing a second wave of a second and different frequency;
   a mixer for mixing said first and second waves to produce a third wave of a third frequency corresponding to the difference between said first and second frequencies;
   means for dividing the frequency of said third wave to produce a carrier wave of a frequency corresponding to said third frequency divided by $2^n$ wherein $n$ is an integer;
   a microphone circuit producing an audio frequency input signal;
   a generator for producing a double sideband wave from said carrier wave and said audio input signal;
   a filter for separating one of the sidebands from said double sideband wave to produce a single sideband modulated wave;
   a second mixer to which said single sideband modulated wave is delivered; and
   selector means for selectively delivering to said second mixer either of said first and second waves in a relation producing selectively either an upper sideband output wave or a lower sideband output wave.

17. Single sideband wave generating apparatus as recited in claim 16, in which said frequency dividing means include $n$ flip flops.

18. Single sideband wave generating apparatus as recited in claim 17, including an amplifier for amplifying said output waves, and an antenna to which the amplified output waves are delivered.

19. Single sideband wave generating apparatus as recited in claim 16, in which said first frequency plus said carrier frequency equals the frequency of said single sideband output waves, and said second frequency minus said carrier frequency equals the frequency of said single sideband output waves.

* * * * *